United States Patent
Schmidt et al.

(10) Patent No.: US 6,681,209 B1
(45) Date of Patent: *Jan. 20, 2004

(54) METHOD AND AN APPARATUS FOR SAMPLING-RATE CONVERSION OF AUDIO SIGNALS

(75) Inventors: Jürgen Schmidt, Wunstorf (DE); Ernst F. Schröder, Hannover (DE)

(73) Assignee: Thomson Licensing, S.A., Boulogne-Billancourt (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/309,704

(22) Filed: May 11, 1999

(30) Foreign Application Priority Data

May 15, 1998 (EP) ............................................. 98108860

(51) Int. Cl.⁷ ............................................... G10L 19/00
(52) U.S. Cl. ...................................... 704/500; 704/219
(58) Field of Search ................................. 704/500, 220, 704/200, 219, 229, 203, 221; 341/123, 126

(56) References Cited

U.S. PATENT DOCUMENTS

| 4,630,034 A | 12/1986 | Takahashi | .................... 341/106 |
| 4,990,911 A | 2/1991 | Fujita et al. | ................. 341/123 |
| 5,204,827 A | 4/1993 | Fujita et al. | ................. 708/313 |
| 5,495,432 A | 2/1996 | Ho | ............................... 708/313 |
| 5,559,513 A | 9/1996 | Rothermel et al. | ............ 341/61 |
| 5,581,652 A | 12/1996 | Abe et al. | .................... 704/222 |
| 5,610,942 A | 3/1997 | Chen et al. | .................. 375/242 |
| 5,819,212 A | * 10/1998 | Matsumoto et al. | ......... 704/219 |
| 5,903,482 A | 5/1999 | Iwamura et al. | ............... 341/61 |
| 6,092,041 A | * 7/2000 | Pan et al. | .................... 704/229 |

FOREIGN PATENT DOCUMENTS

| EP | 692 881 A1 | 1/1996 | ............ H03M/7/30 |
| WO | WO86/02217 | 4/1986 | ............ H03M/1/02 |

OTHER PUBLICATIONS

B. Edler: *Aliasing Reduction in Sub–Bands of Cascaded Filter Banks with Decimation*, Electronics Letters, vol. 28, No. 12, Jun. 4, 1992, pp. 1104–1106.

* cited by examiner

*Primary Examiner*—Daniel Abebe
(74) *Attorney, Agent, or Firm*—Joseph S. Tripoli; Joseph J. Laks; Reitseng Lin

(57) ABSTRACT

Generally, performing sampling-rate conversion from a higher sampling frequency fs1 to a lower sampling frequency fs2 results in aliasing. It is known to use a low-pass filter, known as anti-alias filter, for avoiding this alias distortion. Its effect is to remove spectral contents above fs2/2 from the digital signal. According to the invention these signal parts are suppressed at spectral decoding resulting in a bandwidth of the signal to be re-sampled which is less than half of the second sampling frequency fs2. This can be done for MPEG encoded audio signals by limiting the decoding to a certain number of subbands, for DOLBY AC-3 encoded audio signals by setting certain spectral lines to zero at decoding. The inventive method not only totally removes the processing power needed for calculating an anti-alias filter, but also limits the decoding work needed.

6 Claims, 3 Drawing Sheets

METHOD AND AN APPARATUS FOR SAMPLING-RATE CONVERSION OF AUDIO SIGNALS

FIELD OF THE INVENTION

The invention relates to a method and an apparatus for sampling-rate conversion of audio signals, especially for sampling-rate conversion at the decoding of MPEG audio or DOLBY AC-3 encoded signals.

BACKGROUND OF THE INVENTION

Today many different sampling rates exist like 44.1 kHz for Compact Disc, 32 kHz and 48 kHz for DAT, Digital-VCR or Sat-TV and 48 kHz or 96 kHz for DVD audio signals. Therefore, a change of the sampling-rate is necessary if the internal sampling-rate of the decoder of a playback or recording device differs from the sampling-rate of the audio signal to be decoded.

SUMMARY OF THE INVENTION

Generally, performing sampling-rate conversion from higher to lower sampling frequency (e.g. 48 to 32 kHz) results in aliasing like shown in FIG. 1. The schematic spectrum SPEC1 of the digital signal sampled with fs1 is shown in FIG. 1a). After re-sampling with fs2<fs1, the digital signal has a spectrum SPEC2 according to FIG. 1b). The overlapping regions OV already show that aliasing errors have occurred. After consecutive D/A conversion and appropriate low-pass filtering an analog signal with spectrum SPEC3 shown in FIG. 1c) results, which contains severe alias distortion AL.

It is known to use a low-pass filter, known as anti-alias filter, for reducing or totally avoiding this alias distortion by decreasing or removing spectral contents above fs2/2 from the digital signal. However, calculating the anti-alias filter requires additional processing power which is desirable to save.

The invention is based on the object of specifying a method for sampling-rate conversion of audio signals without the use of an anti-alias filter. This object is achieved by means of the method specified in claim 1.

The invention is based on the further object of specifying an apparatus for carrying out the method according to the invention. This object is achieved by means of the apparatus specified in claim 6.

In principle, the method for sampling-rate conversion of audio signals, which are sampled with a first sampling frequency before spectral encoding and are re-sampled after spectral decoding with a second sampling frequency which is smaller than the first sampling frequency, consists in the fact that the signal parts beyond an upper frequency limit are reduced, advantageously suppressed, at spectral decoding resulting in a bandwidth of the signal to be re-sampled which is less than half of the second sampling frequency.

This method not only totally removes the processing power needed for calculating an anti-alias filter, but also limits the decoding work needed.

In an advantageous manner, the spectral encoding algorithm uses subband coding.

In this case, it may be particularly advantageous if the subband coding algorithm corresponds to the MPEG standard and the decoding is limited to the first 20 subbands.

In a further advantageous development the spectral encoding algorithm uses a transformation into the frequency domain, e.g. DFT.

In this case, it may be particularly advantageous if the spectral encoding algorithm corresponds to the AC-3 standard and spectral lines are reduced or set to zero at decoding.

In principle, the apparatus for carrying out the inventive method consists in a sample rate converter for sampling-rate conversion of a digital audio signal from a first sampling-rate to a second sampling-rate, consists in the fact that a frequency-to-time converter suppresses the signal parts of the digital audio signal beyond an upper frequency limit resulting in a bandwidth of the signal to be re-sampled which is equal to or less than half of the second sampling frequency.

The invention may be particularly advantageous if the apparatus is part of an audio decoder for decoding audio data according to any MPEG audio or the DOLBY AC-3 standard.

Figure 1A:
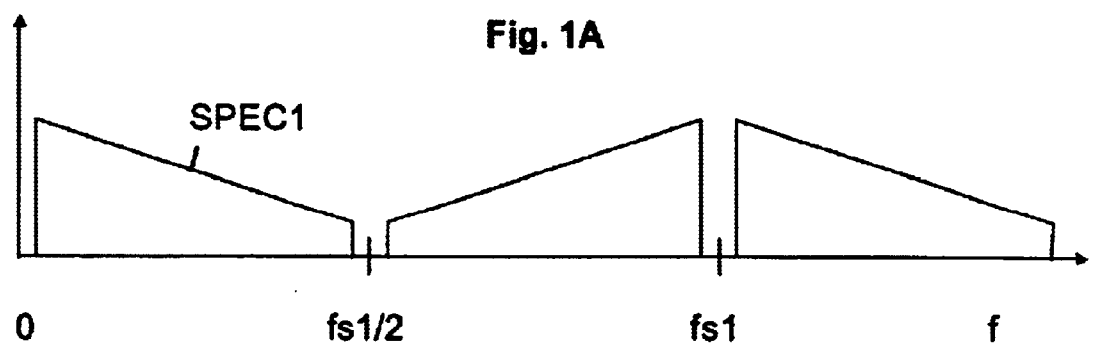
FIG. 1 shows an example of sampling rate conversation
Figure 1B:
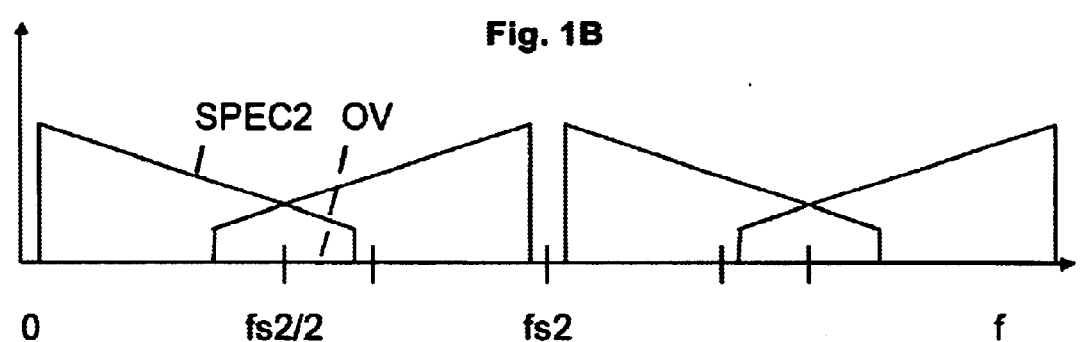
Figure 1C:
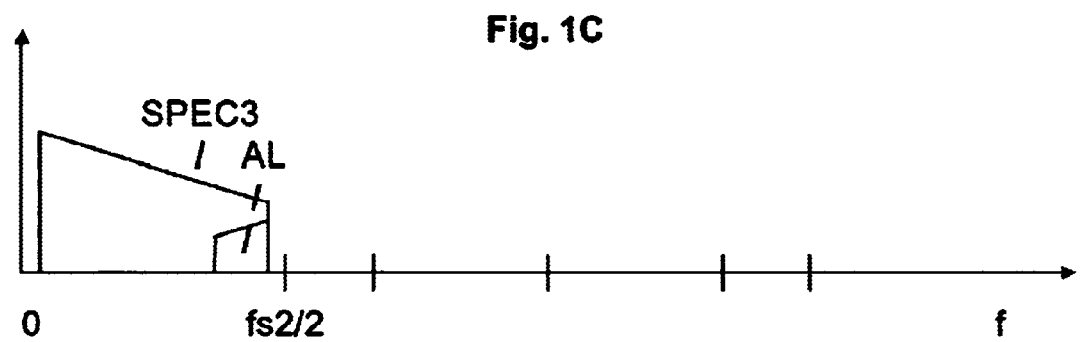
Figure 2A:
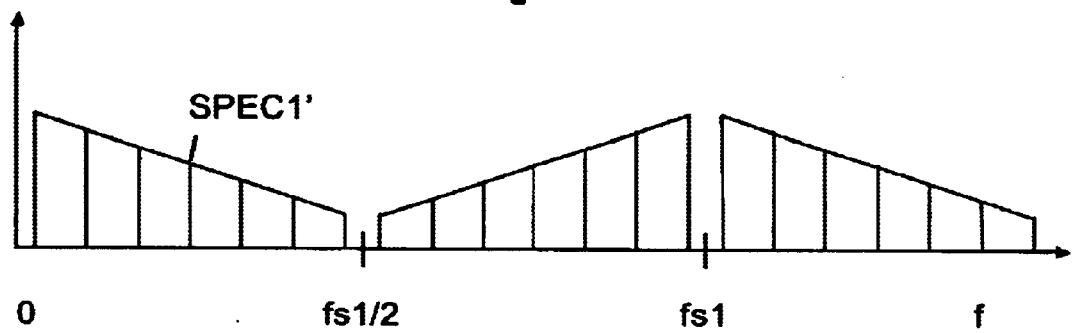
Figure 2B:
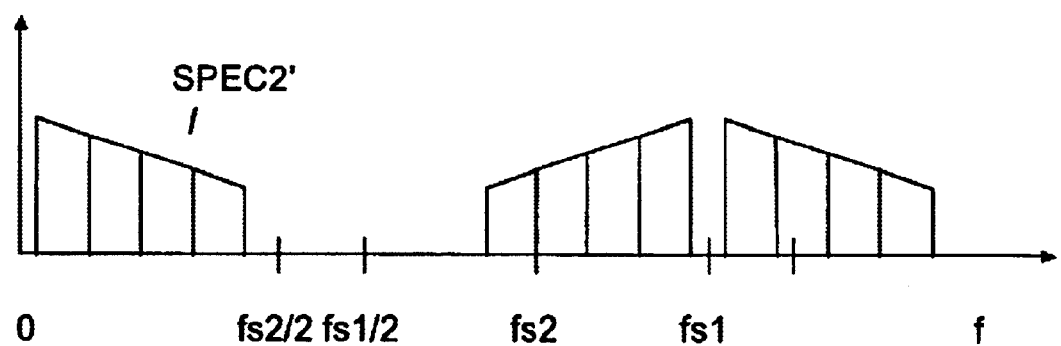
Figure 2C:
Figure 3:
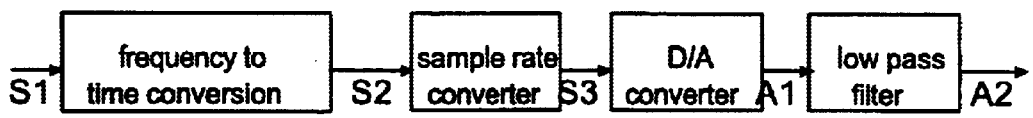

Exemplary embodiments of the invention are described with reference to FIGS. 2 and 3. These show in:

FIG. 2 a) a schematic example spectrum with 6 subbands, b) the example spectrum after decoding, c) the anolog output after subsequent D/A conversion and low pass filtering;

FIG. 3 a block diagram of a decoding arrangement according to the invention.

DETAILED DESCRIPTION OF PREFERRED EMBODIMENTS

FIG. 2 illustrates the method according to the invention for MPEG coded audio signals. As specified in the ISO/IEC 11172-3 standard, which defines the coding for MPEG1 audio signals and which is also valid for MPEG2 audio signals specified in the following ISO/IEC 13818-3 standard, subband coding is performed for data reduction. The subband coding splits up the audio spectrum into 32 different frequency bands to exploit the fact that the human ear can be modeled as a multiband spectrum analyzer. Each of the 32 subbands has a bandwidth which is $\frac{1}{32}$ of half the sampling rate, i.e. 750 Hz for a sampling rate of 48 kHz. The band-splitting process corresponds to a time-to-frequency conversion and is performed by using a special subband coding algorithm for calculating a filterbank. The following quantization and data reduction is achieved by applying a psychoacoustic model. At the decoding end the bands have to be recombined into the original broadband signal by the inverse frequency-to-time conversion.

After frequency-to-time conversion a digital signal sampled at fs1 (e.g. 48 kHz) has a spectrum SPEC1' as shown in FIG. 3a where for clarity reasons only 6 subbands are shown. The previous frequency domain representation is shown as sections in the schematic spectrum. When the frequency-to-time conversion is done in a way which suppresses the signal contents in the upper frequency range, a spectrum SPEC2' as shown in FIG. 3b having only 4 subbands results. After subsequent D/A conversion and suppressing of the harmonic signals by a subsequent low pass filter finally the spectrum SPEC3' of FIG. 3c results without any alias distortions.

A similar approach is possible for Dolby AC-3 which uses transform coding. At transform coding a time-windowed version of the input signal is transformed into the frequency domain by a time-to-frequency transformation such as a DFT (Discrete Fourier Transformation), a DCT (Discrete Cosine Transformation) or specially modified versions thereof. Values in the frequency domain are then quantized by using psychoacoustic phenomenons, coded and transmitted. In the decoder the frequency values are expanded and re-transformed into the time domain. In this case the signal contents in the upper frequency range can be reduced or suppressed during the frequency-to-time conversion by setting spectral lines to reduced values or even to zero.

FIG. 3 shows a block diagram of a decoding arrangement according to the invention. The encoded signal S1 with a sampling-rate fs1 is first fed to a frequency-to-time converter FTC which performs the conversion in a way which suppresses the signal contents in the upper frequency range. The resulting signal S2 has a spectrum as shown in FIG. 3b and is fed to a sample rate converter SPR. The sample rate converter SPR performs the above described sampling-rate conversion from the first sampling-rate fs1 to the second sampling-rate fs2 and yields a signal S3. This digital signal S3 is converted into an analog signal A1 by the D/A converter DA. Finally a low pass filter LPF at fs2/ yields the output signal A2.

The invention can advantageously be used within a TV receiver which is connected with a DVD player. Encoded DVD audio signals use sampling frequencies of 48 or 96 kHz. For various purposes it is desirable to do the decoding of the AC-3 or MPEG audio signals not in the DVD player but in the connected TV receiver, which typically uses internal sampling rates of 32 kHz and a frequency range for playback of 15 kHz. The sampling rate conversion can be performed according to the invention without anti-alias filter by not decoding the signal parts beyond the new upper limit frequency. Generally, for MPEG audio signals according to the ISO/IEC 11172-3 standard using the mentioned sampling rates and typical bit rates, only 27 of the 32 subbands are decoded. Therefore, by using the invention, the upper 7 of the 27 subbands are not to be decoded, i.e. the decoding is limited to the first 20 subbands (20×750 Hz=15 kHz).

Furthermore, the invention can be used in all other devices for recording or reproduction of digitally coded audio signals such as e.g. set top boxes, all kinds of tape recorders, computer devices. Finally, the invention is not restricted to MPEG or DOLBY AC-3 coded audio signals but also applies to audio signals coded by other bit-rate saving algorithms which are based on the signal representation by its spectral contents.

What is claimed is:
1. A decoding method for decoding an encoded audio signal, comprising:
  receiving a frequency domain representation of said encoded audio signal;
  wherein the received audio signal was sampled at a first sampling frequency before being encoded;
  reducing portions of said received frequency domain represented audio signal representing frequencies beyond half of a second sampling frequency;
  decoding said received and reduced audio signal to produce a sampled audio signal that is sampled at said first sampling frequency; and
  re-sampling said decoded digital audio signals with said second sampling frequency wherein said decoding and said re-sampling occurring in a same unit and said second sampling frequency is smaller than the first sampling frequency resulting in a band width of the signal to be re-sampled which is less than half of the second sampling frequency thereby preventing aliasing during down sampling.

2. The method set forth in claim 1 wherein said encoded audio signal has been encoded using a subband coding system.

3. The method set forth in claim 2 wherein the decoding method is applied to decode audio signal according to at least one of 1) MPEG audio and 2) DOLBY AC-3.

4. The method set forth in claim 1 wherein the encoding and decoding of the audio signal corresponds to DOLBY AC-3 standard and spectral lines are set to reduced values or to zero at decoding.

5. A decoder comprising:
  means for applying a frequency domain representation of an encoded digital audio signal;
  means for reducing portions of said frequency domain represented digital audio signal representing portions of said frequency domain representing frequency components greater than half a second frequency;
  spectrally decoding said digital audio signal to produce decoded audio signal samples occurring at a first frequency;
  re-sampling said decoded audio signal to produce audio signal samples occurring at a second frequency , wherein said decoding and said re-sampling occurring at a same unit and said second frequency is less than said first frequency resulting in a bandwidth of the signal to be resampled which is less than half of the second sampling frequency thereby preventing aliasing during downsampling.

6. The decoder set forth in claim 5 wherein the decoder operative to decode the audio siganl according to at least one of 1) MPEG audio and 2) DOLBY AC-3 standard.

* * * * *